United States Patent [19]

Cordingley

[11] Patent Number: 5,300,756
[45] Date of Patent: Apr. 5, 1994

[54] METHOD FOR SEVERING INTEGRATED-CIRCUIT CONNECTION PATHS BY A PHASE-PLATE-ADJUSTED LASER BEAM

[75] Inventor: James J. Cordingley, Cumberland, R.I.

[73] Assignee: General Scanning, Inc., Watertown, Mass.

[21] Appl. No.: 780,763

[22] Filed: Oct. 22, 1991

[51] Int. Cl.$^5$ .............................................. B23K 26/06
[52] U.S. Cl. ................................ 219/121.69; 359/559
[58] Field of Search ...................... 219/121.67, 121.68, 219/121.69, 121.73, 121, 74, 121.75, 121, 61; 359/494, 500, 559, 738, 30, 561; 372/26

[56] References Cited

U.S. PATENT DOCUMENTS

| | | | |
|---|---|---|---|
| 3,705,758 | 12/1972 | Haskal | 219/121.68 |
| 4,275,288 | 6/1981 | Makosch et al. | 219/121.75 |
| 4,380,694 | 4/1983 | Dyson | 219/121.67 |
| 4,478,481 | 10/1984 | Fusek et al. | 359/30 |
| 4,518,232 | 5/1985 | Dagenais | 219/121.74 |
| 4,547,651 | 10/1985 | Maruyama | 219/121.67 |
| 4,705,698 | 11/1987 | Van Dine | 219/121.69 |
| 4,720,620 | 1/1988 | Arima | 219/121.67 |
| 4,765,714 | 8/1988 | Horner et al. | 359/561 |
| 4,937,424 | 6/1990 | Yasui et al. | 219/121.67 |
| 4,947,413 | 8/1990 | Jewell et al. | 359/559 |
| 5,032,002 | 7/1991 | Fonneland et al. | 359/559 |
| 5,034,591 | 7/1991 | Fang | 219/121.69 |
| 5,048,029 | 9/1991 | Skupsky et al. | 372/26 |
| 5,103,073 | 4/1992 | Danilov et al. | 219/121.68 |
| 5,208,437 | 5/1993 | Miyauchi et al. | 219/121.67 |

FOREIGN PATENT DOCUMENTS

| | | | |
|---|---|---|---|
| 1157808 | 11/1963 | Fed. Rep. of Germany | 359/494 |
| 2355655 | 6/1974 | Fed. Rep. of Germany | 359/494 |
| 59-127990 | 7/1984 | Japan | 219/121.72 |
| 2-137688 | 5/1990 | Japan | 219/121.61 |
| 3-94986 | 4/1991 | Japan | 219/121.73 |
| 907498 | 2/1982 | U.S.S.R. | 359/494 |

OTHER PUBLICATIONS

W. W. Simmons et al., "Optical Beam Shaping Devices Using Polarization Effects", *Applied Optics, Jul., 1974*.

Y. Kawamura et al., "A Simple Optical Device for Generating Square Flat-Top Intensity Irradiation from a Gaussian Laser Beam", *Optics Communications*, Nov. 1, 1983.

Patrick W. Rhodes et al., "Refractive Optical Systems for Irradiance Redistribution of Collimated Radiation: Their Design and Analysis", *Applied Optics*, Oct. 15, 1980.

Dominique M. Dagenais et al., "Optical Beam Shaping of a High Power Laser for Uniform Target Illumination", *Applied Optics*, Mar. 1, 1985.

W. B. Veldkamp, "Laser Beam Profile Shaping with Interlaced Binary Diffraction Gratings", *Applied Optics*, Sep. 1, 1982.

Wilfrid B. Veldkamp et al., "Beam Profile Shaping for Laser Radars That Use Detector Arrays", *Applied Optics, Jan. 15, 1982.*

*Primary Examiner*—Geoffrey S. Evans
*Attorney, Agent, or Firm*—Cesari and McKenna

[57] ABSTRACT

A method for severing integrated-circuit conductive links by laser power employs a phase plate (26) to shape the laser beam's intensity profile. The profile thus imparted to the beam approximates the Fourier transform of the intensity profile desired on the workpiece (34). As a consequence, when a focusing lens (32) receives a beam having the profile imparted by the phase plate (26), it focuses that beam into a spot on the workpiece (34) having an intensity profile more desirable than the ordinary Gaussian laser-beam profile.

9 Claims, 2 Drawing Sheets

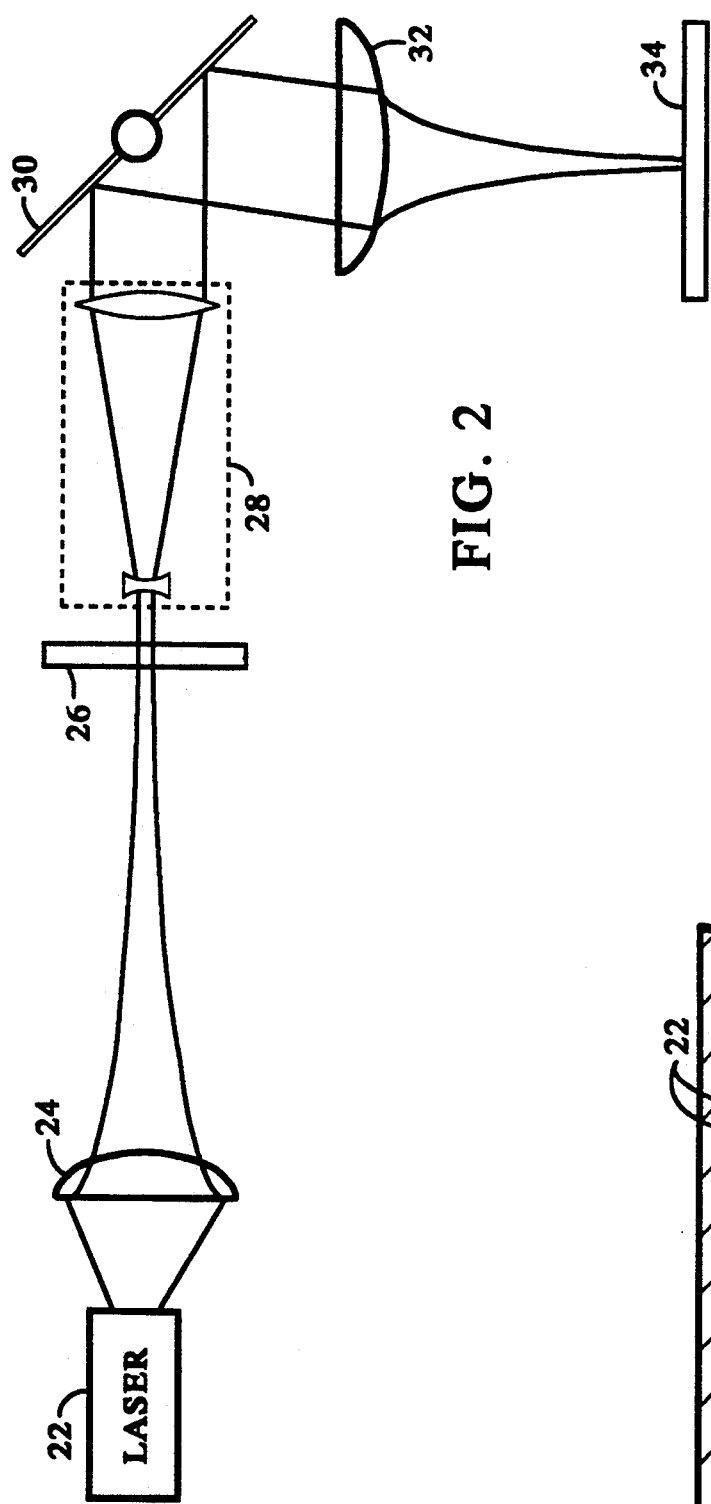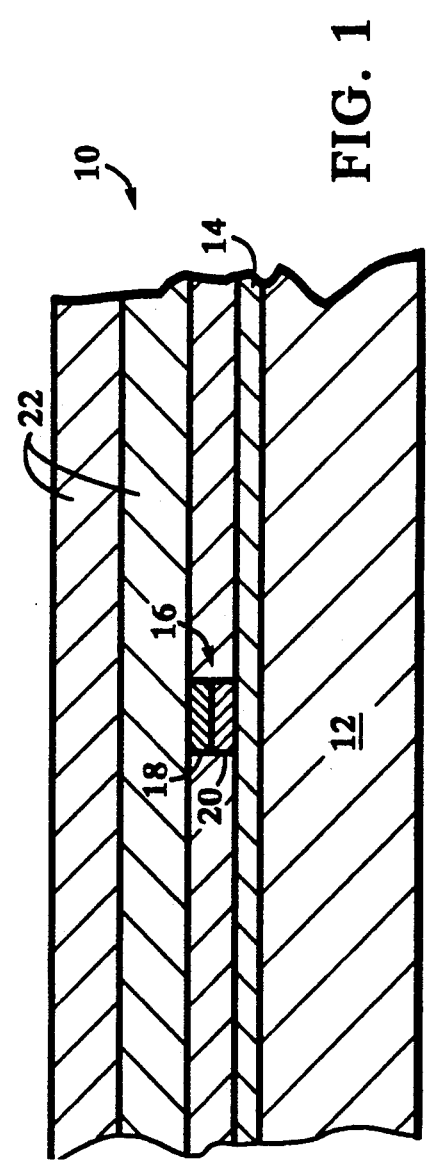

METHOD FOR SEVERING INTEGRATED-CIRCUIT CONNECTION PATHS BY A PHASE-PLATE-ADJUSTED LASER BEAM

BACKGROUND OF THE INVENTION

The present invention is directed to the use of laser light in integrated-circuit fabrication. It is directed particularly to severing conductive links in otherwise completed electronic circuits so as to indicate which parts of the circuit are defective and cannot be used and which spare parts of the circuit are to be used in their stead.

The designs of some large semiconductor-memory chips take into account the fact that the high number of memory cells makes a fabrication defect likely. To reduce the resultant waste, these designs include extra cells in the form of spare rows and columns that can be brought into use if a standard row or column is found to be defective. If testing reveals that a row or column is defective, the manufacturer vaporizes certain conductive links in the chip, thereby removing the defective row or column from service and programming the chip to replace the removed row or column with one of the spares.

The chip 10 of FIG. 1 shows in simplified form a possible arrangement of one of the conductive links used for encoding. Formed on a thick substrate 12 of single-crystal silicon might be a thin layer 14 of silicon dioxide. A conductive link 16 made, for instance, of a tungsten or molybdenum layer 18 bonded by sintering to a polysilicon layer 20 may be disposed between layer 14 and one or more oxide layers 22.

To break the link 16, a laser beam is focused through the layers 22, which are essentially transparent to the laser-beam wavelength employed, and onto the link, which absorbs the laser-beam energy and vaporizes, rupturing the layers above it to allow the erstwhile link material to escape.

Successful application of this technique depends greatly on various process parameters as well as on the particular chip design. Excessively intense laser radiation at isolated locations, for example, can result in damage to surrounding material, such as the thin oxide layer 14, and could thus result in operational defects. On the other hand, insufficient beam intensity or duration tends to permit flashing that causes undesirable remaining continuity in the link.

For this reason, considerable effort has been directed to so adjusting various process variables as to sever links reliably. One such process variable is the beam's intensity profile. Ordinarily, the intensity profile of a laser beam is Gaussian as a function of distance from the center of the beam. This profile is not optimum for link severing, however, because a significant length of the link needs to be vaporized; if the skirt regions of the Gaussian curve are to be counted on to provide the necessary vaporization energy, the center, peak region of the beam may deliver excess power at a localized region in the link and thus cause damage to the chip. This effect is exacerbated by the nonlinear nature of the heating process: the hotter the link material becomes, the more efficient it is at absorbing energy from the beam. On the other hand, if only the central, maximum region is counted on to deliver the requisite vaporizing intensity, then the beam has to be widened to such an extent that the total laser power required for a given intensity is undesirably high.

For these reasons, efforts have been made to make beam intensity more uniform. In one link-vaporizing arrangement, for instance, the beam is directed to an aperture through which only the central part of the beam can pass. To some extent, this approach does contribute to intensity uniformity. But it suffers from the inefficiency that arises from the fact that the power in the outer parts of the Gaussian curve is wasted. Moreover, I have found that such an approach tends to result in "hot spots" that result from diffraction that the aperture causes.

SUMMARY OF THE INVENTION

I have developed an approach that is both simple to implement and efficient in its use of laser power. Specifically, I insert a phase plate into the laser beam's optical path. The phase plate imposes a spatial phase modulation on the beam, and I place the plate at such a part of the path that a replica of the resultant phase-modulated beam (typically after some scaling) is received by the lens or other image-forming optical element that focuses the beam onto the workpiece. The intensity profile of the resultant spot on the workpiece has the shape of the spatial-frequency power spectrum of the phase-modulated beam. By appropriate phase modulation, one can achieve a more-uniform intensity profile on the workpiece without suffering the significant power loss that attends aperture (i.e., amplitude-modulation) approaches.

The phase plate can be quite simple; I have obtained good results with a simple two-region binary phase plate, in which a central region imposes a phase shift 180° different from that imposed by an outer region. Moreover, as will be shown below, such an arrangement can easily be made adjustable so as to enable the operator to optimize the process empirically with very little effort.

BRIEF DESCRIPTION OF THE DRAWINGS

These and further features and advantage of the present invention are described below in connection with the accompanying drawings, in which:

FIG. 1 is a simplified cross-sectional view of a workpiece of the type on which the present invention might be employed;

FIG. 2 is a block diagram illustrating an apparatus for performing the method of the present invention;

DETAILED DESCRIPTION OF AN ILLUSTRATIVE EMBODIMENT

Figure 3:
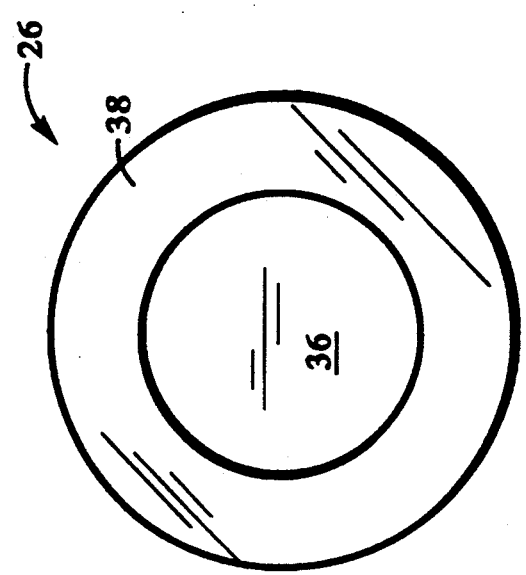
FIG. 3 is a plan view of the phase plate employed in the apparatus of FIG. 2.

An apparatus 20 represented in simplified form in FIG. 2 includes a laser 22. For various reasons not important here, the beam diverges somewhat, and a "collimating" lens 24 removes that divergence and in fact causes the beam to converge slightly. After passing through a phase plate 26, whose purpose will be described below, the beam, whose $1/e^2$ beamwidth at this point is approximately 1.5 mm, is up-collimated in a telescope 28 to a 12.6 mm beam so that subsequent focusing can yield a sufficiently small spot size.

To direct the beam to the proper link on the workpiece, a scanner (which may be a two-dimensional but is represented in FIG. 2 as comprising only a single mirror 30) deflects the beam and directs it through a focusing lens 32, which has a 50 mm focal length and focuses the beam to a spot approximately 8.3 μin diameter. This spot size is chosen because it is desirable to vaporize as much of the length of the 8-10-μ-long link as possible. (Actually, countervailing considerations in some applications, such as the closeness of neighboring links, sometimes dictate a smaller spot size, but vaporizing as long a portion of the link as possible is usually desirable in the absence of such factors.)

With the exception of the phase plate 26, the apparatus as depicted in FIG. 2 is conventional. Because of the phase plate, however, the intensity profile of the beam that reaches the workpiece 34 is more uniform in its central region than the conventional Gaussian profile.

Figure 4:
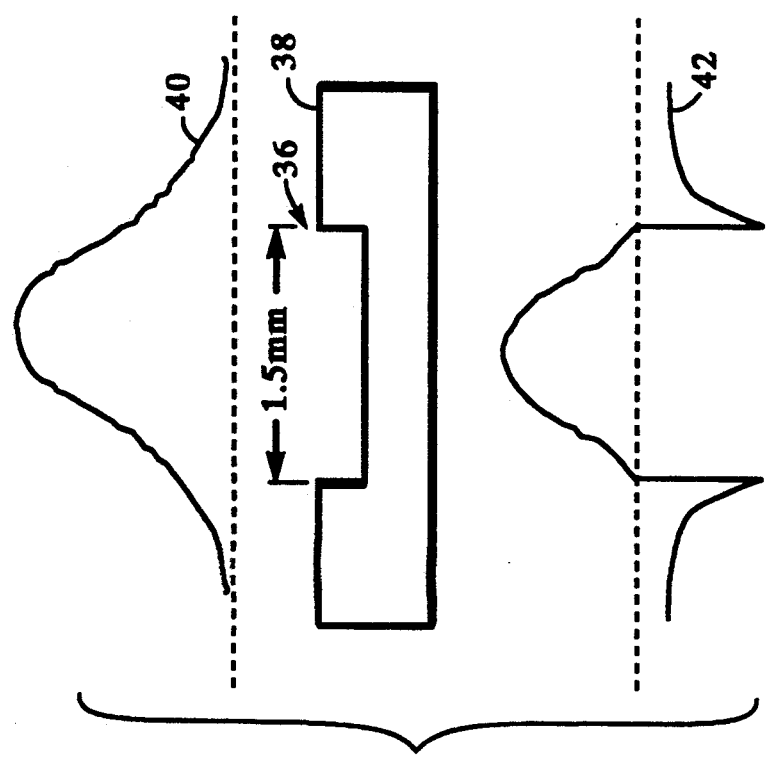
FIG. 4 is a cross-sectional view of that phase plate.

The reason for this can be understood by reference to FIGS. 3 and 4. FIG. 3 shows the phase plate 26 in plan view and depicts it as having separate concentric inner and outer regions 36 and 38, respectively. The phase plate 26 is made of a material, such as quartz, that is essentially transparent to light of the wavelength, namely, 1.047 μ, that the laser produces.

As FIG. 4 shows, the central region 36 is 1.5 mm in diameter in the illustrated embodiment, and its thickness differs from that of the outer region 38 by 1.17 μ. Given the phase plate's index of refraction of 1.449, this results in a differential phase retardation of 180°. As curve 40 of FIG. 4 suggests, the boundary between the two regions 36 and 38 hits the intensity curve at approximately the $1/e^2$ point in the intensity profile, i.e., the $1/e$ point in the amplitude profile 40. The precise point that the boundary hits in the intensity profile is not critical, but the part of the beam that the central region receives ordinarily carries most of the beam's power. The result is illustrated by curve 42, which represents the phase-shifted part of the beam as having a negative amplitude and shows that the phase shifting causes a zero to occur in the intensity profile.

The result is (to a scale factor) a rough approximation of $[J_1(2\pi r)]/r$ where $J_1$ is the first-order Bessel function of the first kind and r is the distance from the beam axis. This is the Hankel transform (i.e., the polar-coordinate counterpart to the Fourier transform) of the circ(r) function, which represents uniform amplitude out to a maximum radius and zero beyond. Employing imaging optics to focus the beam thus modulated should accordingly produce an image whose intensity profile approximates the circ(r) function.

Since the features of the phase plate 26 transverse to the beam are very large in comparison with the laser light's wavelength, the beam substantially retains the phase-plate-imparted intensity profile as it propagates toward the up-collimating telescope 28, whose double transformation results in only a scale change and thus preserves that intensity profile. The focusing lens 32 accordingly receives the intensity profile imparted by the phase plate, and, in focusing the beam onto the workpiece, produces a spot whose intensity profile has the shape of the received beam's power spectral density; i.e., it approximates the circ(r) function, being more uniform than a Gaussian beam in the regions in which it is desired to vaporize the conductive link.

As was observed above, the intensity profile that results from the particular type of phase plate illustrated in the specification is only a rough approximation to the Fourier transform of the desired profile; clearly, it produces only one phase reversal and thus only the first zero in $[J_1(2\pi r)]/r$. One might therefore expect more-exact results from a phase plate having a plurality of concentric phase boundaries and thus a plurality of zeros that match the zeros of the Bessel function. Indeed, I believe that such an embodiment of my invention may be desirable in some applications. However, I have achieved results adequate to my application with only the illustrated two-region plate.

One might also note that the desirability of a circular intensity function at the target has been tacitly assumed. Again, I have found the results obtained with such a function to be adequate. However, the invention could also be employed by using a phase plate whose pattern is not circularly symmetrical and instead produces a transform pattern that is, like the target link, more oblong.

Whatever the pattern is, however, the phase-plate approach yields significant advantages. Not only is the phase plate simple and inexpensive, but its use requires no additional optical elements in the apparatus. Moreover, it is relatively efficient; rather than achieving the desired shape by blocking some of the laser light and thus reducing its power, as the aperture approach does, the phase plate merely changes its phase so as to redirect the power to where it is needed. In contrast to the diffraction caused by the aperture-system discontinuity, moreover, the corresponding diffraction in this phase-plate approach is beneficial, causing the zero in the phase-modulated beam that results in its approximating the transform of the desired profile. Another advantage of this approach, as compared with others that might be suggested, is that it does not result in polarization changes, so it does not affect the operation of the polarization-sensitive elements that such laser systems typically employ.

A further feature, which I have found particularly advantageous, is that the beam profile can be easily varied without necessarily changing the phase plate. As was stated above, the collimating lens 24 that I employ is arranged to cause the beam to converge slowly; it images the laser's exit aperture onto a plane 500-600 mm from the collimating lens. This convergence (or, equivalently, a slow divergence) enables the phase plate's effect to be changed by simply moving the plate or collimating lens along the beam axis. The first-order effect is the same as that of varying the size of the phase plate's central region 36. (Another effect results from the fact that, although the beam is very nearly a plane wave, it does have some slight curvature, whose radius changes with distance along the beam. This effect is minor, however, and does not detract significantly from the essentially binary nature of the phase modulation that the phase plate imposes.) This mode of adjusting the central region's influence makes it easy to optimize the beam shape empirically.

A further degree of adjustability is afforded by pivoting the phase plate about an axis that lies in a plane perpendicular to the beam axis. Such pivoting varies the differential phase retardation that the phase plate imposes. It has been reported that departing from the strict 180° difference in a two-zone plate can actually improve beam uniformity, and such pivoting incidentally results in an oblong pattern, which, as was mentioned above, can be desirable. Moreover, this easy adjustability could be advantageous even if it did not have the potential to increase the uniformity of the beam's intensity; it turns out that the beam shape that results in the best performance in a given situation is not always the shape that is closest to rectangular in cross section.

In view of these advantages, it is apparent that the invention constitutes a significant advance in the art.

I claim:

1. In the method of severing a conductive link in an integrated circuit by employing an imaging optical element to focus on the link a laser beam produced by a laser, the improvement wherein:
    A) the method further comprises the step of directing the beam through a substantially transparent phase plate, separate from the laser, that spatially phase-modulates the beam; and
    B) the imaging optical element focuses the beam as thus phase modulated onto the conductive link, whereby the resulting image on the integrated circuit has the shape of the phase-modulated beam's spatial-frequency power spectrum.

2. A method as defined in claim 1 wherein the phase plate is a binary phase plate, which imposes at any point thereon only one or the other of two different phase changes.

3. A method as defined in claim 2 wherein the two phase changes differ from each other by substantially an odd multiple of 180°.

4. A method as defined in claim 3 wherein the phase plate includes a single central region, which imposes one of the two phase changes on the central part of the laser beam, and an outer region, which imposes the other of the two phase changes on at least a part of the remainder of the laser beam.

5. A method as defined in claim 4 wherein the central region of the phase plate receives a portion of the beam that carries the majority of the beam's power.

6. A method as defined in claim 5 wherein the phase plate includes only one central region and one outer region.

7. A method as defined in claim 2 wherein the phase plate includes a single central region, which imposes one of the two phase changes on the central part of the laser beam, and an outer region, which imposes the other of the two phase changes on at least a part of the remainder of the laser beam.

8. A method as defined in claim 7 wherein the central region of the phase plate receives a portion of the beam that carries the majority of the beam's power.

9. A method as defined in claim 8 wherein the phase plate includes only one central region and one outer region.

* * * * *